US008789507B2

(12) United States Patent
Doub

(10) Patent No.: US 8,789,507 B2
(45) Date of Patent: Jul. 29, 2014

(54) METHOD FOR MONITORING AN ENGINE STARTING SYSTEM AND ENGINE INCLUDING STARTING SYSTEM MONITOR

(75) Inventor: John Elvin Doub, Waynesboro, PA (US)

(73) Assignee: Mack Trucks, Inc., Greensboro, NC (US)

( * ) Notice: Subject to any disclaimer, the term of this patent is extended or adjusted under 35 U.S.C. 154(b) by 1197 days.

(21) Appl. No.: 12/602,983

(22) PCT Filed: Jun. 18, 2007

(86) PCT No.: PCT/US2007/071461
§ 371 (c)(1),
(2), (4) Date: Dec. 3, 2009

(87) PCT Pub. No.: WO2008/156478
PCT Pub. Date: Dec. 24, 2008

(65) Prior Publication Data
US 2010/0175656 A1    Jul. 15, 2010

(51) Int. Cl.
F02N 11/08    (2006.01)
F02N 11/10    (2006.01)
H02J 7/14    (2006.01)
G01R 31/00    (2006.01)
F02D 41/06    (2006.01)
F02P 5/15    (2006.01)
F02D 41/22    (2006.01)

(52) U.S. Cl.
CPC ............. H02J 7/1461 (2013.01); G01R 31/006 (2013.01); F02D 41/062 (2013.01); F02N 11/10 (2013.01); F02P 5/1506 (2013.01); F02N 2300/102 (2013.01); F02D 41/22 (2013.01)
USPC .................................... 123/179.3

(58) Field of Classification Search
USPC ......... 123/179.3, 179.4, 198 D; 701/107, 113
See application file for complete search history.

(56) References Cited

U.S. PATENT DOCUMENTS 3,569,724 A    3/1971  Kuehn, III
3,991,357 A   11/1976  Kaminski
(Continued)

FOREIGN PATENT DOCUMENTS

JP    61101671    5/1986
JP    5131940     5/1993
(Continued)

OTHER PUBLICATIONS

Official Action from corresponding Japanese Application 2011-264683 (translation) Dec. 7, 2012.
(Continued)

Primary Examiner — Mahmoud Gimie
Assistant Examiner — Sizo Vilakazi
(74) Attorney, Agent, or Firm — WRB-IP LLP

(57) ABSTRACT

In a method of monitoring an engine starting system in an engine, the engine starting system includes a charging system, a battery, a starter, a flywheel, and a controller. The controller and monitors can monitor components and systems associated with starting of an engine, such as engine or cranking speed, power cylinder unit compression, injection timing, and proper fuel delivery to predict and/or diagnose problems. For example, a charging system voltage is monitored and the charging system voltage is compared with predetermined charging system voltage values. Voltage of the battery is monitored and battery voltage is compared with predetermined battery voltage values. A signal to an operator is provided if one or more of the charging system voltage and the battery voltage are outside of predetermined ranges for the one or more of the charging system voltage and the battery voltage.

5 Claims, 4 Drawing Sheets

(56) References Cited

U.S. PATENT DOCUMENTS

| | | | |
|---|---|---|---|
| 4,543,521 | A | 9/1985 | Morishita et al. |
| 4,646,008 | A | 2/1987 | Takahashi |
| 4,916,327 | A | 4/1990 | Cummins |
| 5,198,698 | A | 3/1993 | Paul et al. |
| 5,332,927 | A | 7/1994 | Paul et al. |
| 5,512,883 | A * | 4/1996 | Lane, Jr. ................. 340/648 |
| 6,438,487 | B1 | 8/2002 | Mingo et al. |
| 6,553,816 | B1 | 4/2003 | Palanisamy et al. |
| 6,646,561 | B1 | 11/2003 | Zur et al. |
| 6,792,346 | B2 | 9/2004 | Takebayashi et al. |
| 7,106,047 | B2 | 9/2006 | Taniguchi |
| 2003/0212484 | A1 | 11/2003 | Takebayashi et al. |
| 2004/0130325 | A1 | 7/2004 | Mauro et al. |
| 2005/0177285 | A1* | 8/2005 | Honda ..................... 701/22 |
| 2009/0217897 | A1* | 9/2009 | Hartmann et al. ....... 123/179.3 |
| 2009/0241884 | A1* | 10/2009 | Saitoh et al. ........... 123/179.4 |

FOREIGN PATENT DOCUMENTS

| | | | | |
|---|---|---|---|---|
| JP | 2000206215 | | 7/2000 | |
| JP | 2003148313 | | 5/2003 | |
| JP | 2003247478 | | 9/2003 | |
| JP | 2003247478 A | * | 9/2003 | ............ F02N 11/08 |
| JP | 2006089014 | | 4/2006 | |
| JP | 2006220113 | | 8/2006 | |

OTHER PUBLICATIONS

Official Action from corresponding Japanese Application 2010-513176 (translation) Aug. 30, 2011.

International Search Report for corresponding International Application PCT/US2007/071461 Sep. 25, 2008.

* cited by examiner

METHOD FOR MONITORING AN ENGINE STARTING SYSTEM AND ENGINE INCLUDING STARTING SYSTEM MONITOR

BACKGROUND AND SUMMARY

The present invention relates to a method for monitoring an engine starting system and an engine including a starting system monitor.

While an important application for the method and engine according to aspects of the present invention is in motor vehicles, such as truck diesel engines, it will be appreciated that the present invention has applications in engines for other uses, as well. Four of the more important requirements to start an engine are engine or cranking speed, power cylinder unit compression, injection timing, and proper fuel delivery.

A great deal of work has already been done to ascertain the health of an engine battery. The fail mode of a battery is often such that it does not give obvious clues to the operator until it malfunctions. This key component supplies the electrical power required for normal operation of a vehicle. A faulty battery often means the vehicle is stranded prior to completing its mission. In commercial applications this results in delaying delivery of goods.

Diagnostic methods have been developed to determine a battery's health. The known methods do an adequate job for this one component but other factors and components also play roles in proper starting. The inventor has recognized that it is desirable to provide a method that can coordinate sensors that can be provided on the engine and/or vehicle to track the starting performance and at least assist in diagnosis of root causes of the various aspects involved in starting an engine, particularly a diesel engine.

According to an aspect of the present invention, a method of monitoring an engine starting system in an engine is provided, the engine starting system comprising a charging system, a battery, a starter, a flywheel, and a controller. According to the method a charging system voltage is monitored and the charging system voltage is compared with predetermined charging system voltage values. Voltage of the battery is monitored and battery voltage is compared with predetermined battery voltage values. A signal to an operator is provided if one or more of the charging system voltage and the battery voltage are outside of predetermined ranges for the one or more of the charging system voltage and the battery voltage.

According to an aspect of the present invention, a method of monitoring an engine starting system in an engine is provided, the engine starting system comprising a charging system, a battery, a starter, a flywheel, and a controller. According to the method, a charging system voltage is monitored and the charging system voltage is compared with predetermined charging system voltage values. A signal is provided to an operator if the charging system voltage is outside of a predetermined range the charging system voltage.

According to an aspect of the present invention, a method of monitoring an engine starting system in an engine is provided, the engine starting system comprising a charging system, a battery, a starter, a flywheel, and a controller. According to the method, current through the starter is monitored and starter current is compared with predetermined starter current values. A signal to an operator is provided if the starter current is outside of a predetermined range for the starter current.

According to an aspect of the present invention, an engine having a starting system comprises a charging system, a controller, and a monitor for monitoring a charging system voltage and sending a signal corresponding to the charging system voltage to the controller. The controller is arranged to compare the charging system voltage with predetermined charging system voltage values and to provide a signal to an operator if the charging system voltage is outside of a predetermined range the charging system voltage.

According to yet another aspect of the present invention, an engine having a starting system comprises a starter, a controller, and a monitor for monitoring current through the starter and sending a signal corresponding to the starter current to the controller. The controller is arranged to compare the starter current with predetermined starter current values and to provide a signal to an operator if the starter current is outside of a predetermined range for the starter current.

BRIEF DESCRIPTION OF THE DRAWINGS

The features and advantages of the present invention are well understood by reading the following detailed description in conjunction with the drawings in which like numerals indicate similar elements and in which.

DETAILED DESCRIPTION

Figure 1:
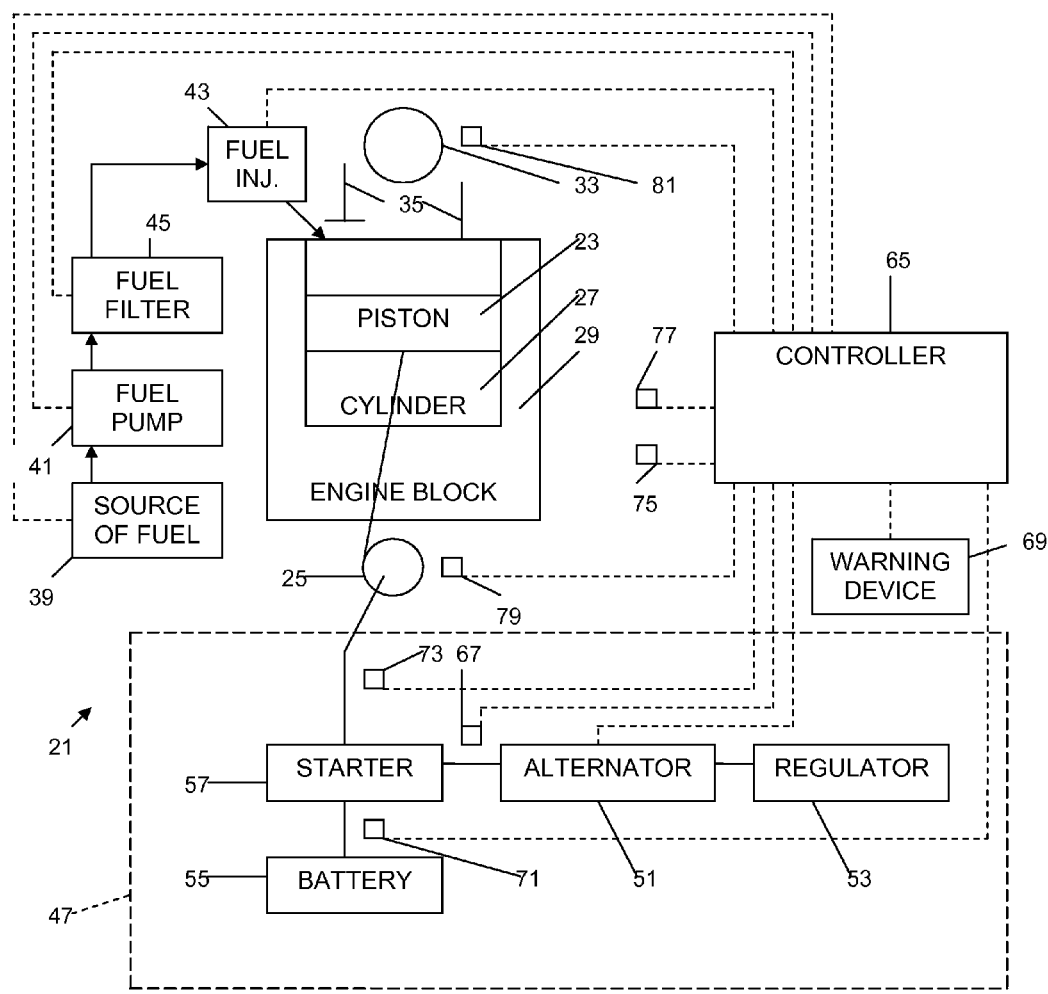
FIG. 1 is a schematic representation of an engine according to an aspect of the present invention.

An engine 21 according to an aspect of the present invention is shown schematically in FIG. 1. The engine 21 comprises a piston 23 attached to a crankshaft 25, the piston moving in a cylinder 27 in the engine block 29 during combustion of fuel in the cylinder and thereby turning the crankshaft. A flywheel (not shown) is attached to the crankshaft 25, and a camshaft 33 can be driven by the crankshaft and opens and closes intake and exhaust valves 35 on the cylinder. A fuel system is provided and includes a source of fuel 39, a fuel pump 41, fuel injectors 43 for injecting fuel into the cylinders, and a fuel filter 45 for filtering the fuel prior to injection.

A starting system 47 for the engine 21 includes a charging system, which can include an alternator 51 having a regulator 53, a battery 55, a starter 57, which typically includes a starter motor with a starter gear adapted to mesh with a ring gear on the crankshaft 25 and turn the crankshaft under power from the battery when an operator operates an ignition switch. References to an "operator" or a "technician" herein will be understood to not necessarily require a human operator or technician, and the words operator and technician will be understood to be generally interchangeable for purposes of the present application.

After the engine 21 is started and the operator turns off the ignition switch, the starter gear moves out of mesh with the ring gear. During operation of the engine 21, the engine drives the alternator 51 to meet electrical needs of the engine and associated articles (such as electrical components of a vehicle (not shown) in which the engine is disposed) and to recharge the battery 55.

The engine 21 also includes a controller 65 such as a computer that can be arranged to control operation of various components and systems of the engine and any associated vehicle, often in conjunction with monitors associated with the components and systems. According to an aspect of the present invention, the controller 65 and monitors can monitor components and systems associated with starting of an engine, such as engine or cranking speed, power cylinder unit compression, injection timing, and proper fuel delivery to predict and/or diagnose problems. In conjunction with monitoring and predicting or diagnosing problems with electrical components and systems associated with engine starting, it is possible to monitor and predict or diagnose problems with various mechanical components and systems according to an aspect of the present invention.

A charging system voltage monitor 67 is provided for monitoring a voltage at the charging system and sending a signal corresponding to the charging system voltage to the controller 65. The controller 65 can be arranged to compare the charging system voltage with predetermined charging system voltage values and to provide a signal to an operator if the charging system voltage is outside of a predetermined range the charging system voltage. The signal can be in any suitable form, such as by operating a warning device 69, such as by powering a warning light or alarm or noting the discrepancy on an operator-readable computer display. By identifying discrepancies in the charging system voltage, start-up system problems can be diagnosed and/or predicted.

A battery voltage monitor 71 for monitoring voltage of the battery 55 and sending a signal corresponding to the battery voltage to the controller 65 can be provided. The controller 65 can be arranged to compare the battery voltage with predetermined battery voltage values and to provide a signal to the operator if the battery voltage is outside of a predetermined range for the battery voltage, such as by operating the warning device 69, such as by powering a warning light or noting the discrepancy on an operator-readable computer display. By identifying discrepancies in the battery voltage, start-up system problems can be diagnosed and/or predicted. For example, if battery voltage fails to increase to a predetermined steady state voltage during normal operation, a signal may be provided that the battery should be checked as this may be a symptom of a weak battery. Additionally, the time that an engine is cranked during starting can be monitored and logged, as an over-long time to start the engine may be a symptom of a weak battery.

A starter current monitor 73 can be provided for monitoring current through the starter 57 and sending a signal corresponding to the starter current to the controller 65. The controller 65 can be arranged to compare the starter current with predetermined starter current values and to provide a signal to an operator if the starter current is outside of a predetermined range for the starter current, such as by operating the warning device 69, such as by powering a warning light or noting the discrepancy on an operator-readable computer display. By identifying discrepancies in the starter current, start-up system problems can be diagnosed and/or predicted.

Figure 2:
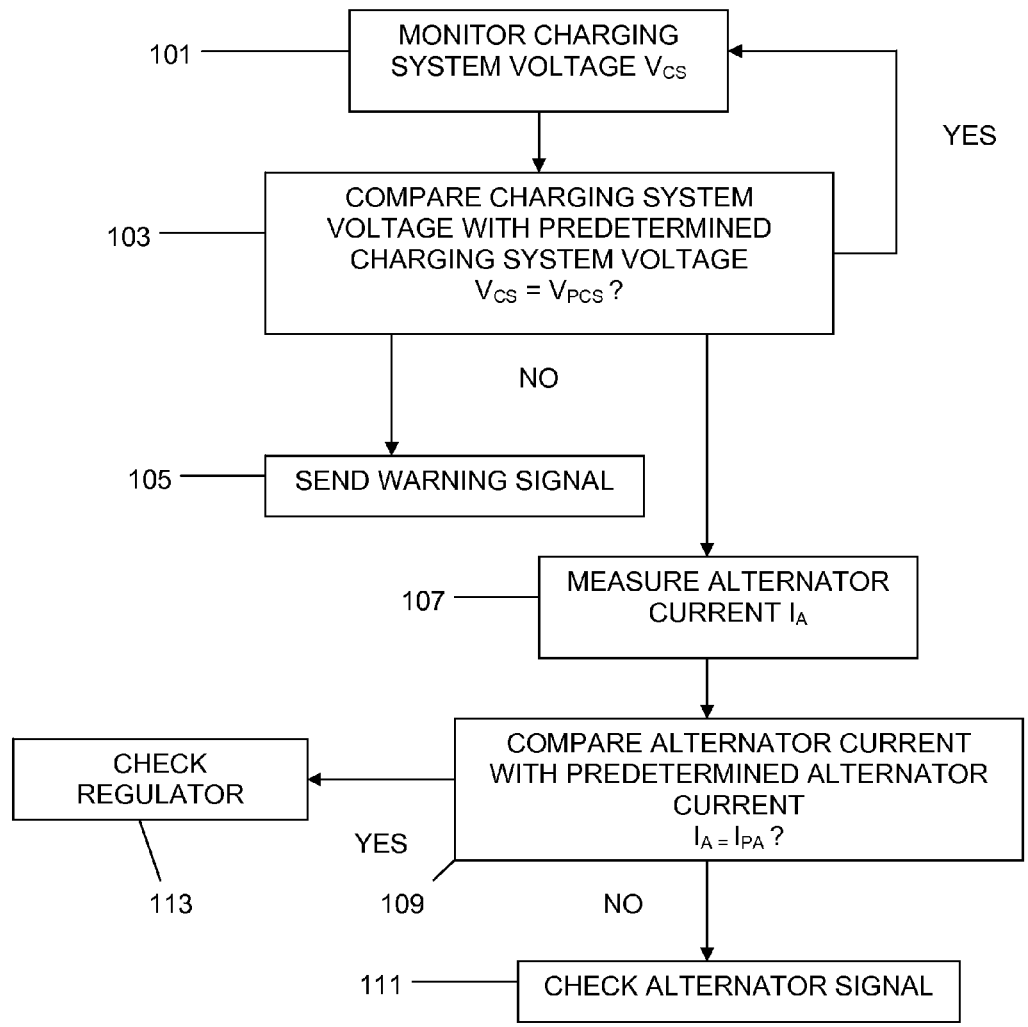
FIG. 2 is a block diagram showing steps in a method according to an aspect of the present invention for monitoring an engine starting system involving monitoring engine charging system voltage.

FIG. 2 shows a flow chart for an aspect of the invention comprising a method of monitoring an engine starting system 47 in an engine 21. The method comprises a step 101 monitoring the charging system voltage $V_{CS}$, such as with the charging system voltage monitor 67 (FIG. 1) and a step 103 of comparing the charging system voltage with predetermined charging system voltage values $V_{PCS}$ using the controller 65. A warning signal can be provided at step 105 via a warning device 69 to an operator if the charging system voltage is outside of a predetermined range the charging system voltage. If the charging system voltage is within the predetermined range, the method can be repeated periodically or continuously. The charging system voltage will ordinarily be monitored during at least one of, typically during each of, start-up, normal operation, and after-run, where after-run is defined for purposes of the present application as key off, no fuel injection, engine revolution decreasing or stopped, and controller 65 still powered up.

If the charging system voltage is outside of a range of values for the predetermined charging system voltage values, a current $I_A$ produced by the alternator 51 of the charging system can be measured at step 107 instead of or in addition to the step of sending a warning signal at step 105. The alternator 51 current can be compared in step 109 against predetermined alternator current values $I_{PA}$. Low alternator current may be indicative of failure of a diode (not shown) in the alternator's rectifier assembly and a check alternator warning signal can be provided at step 111. If alternator current is within predetermined ranges, the problem will often be related to the regulator 53 of the alternator. A signal to the operator to check the regulator 53 can be provided at step 113.

The various predetermined or normalized values that can be used in aspects of the present invention, such as charging system voltage, battery voltage, and starter current, are typically developed empirically. For purposes of the present application, the term "predetermined" values will be understood to refer to values that are calculated or predicted based on performance of similar systems as well as those that are normalized with respect to environmental factors and system degradation and empirical data for the particular system in question. The predetermined values will typically cover a range of values. The acceptable values can be adjusted over time as a function of historical operating data that can be stored by the controller 65 and may be peculiar to a particular engine used in a particular way under particular conditions. For example, the charging system voltage values are empirically developed and typically change as a function of factors including state of charge of a battery, load on an electrical system, and temperature. As a function of historical data, which may vary from engine to engine, the controller can adjust the range of acceptable predetermined values from a previously developed range. Monitors for measuring state of charge of the battery, such as the battery voltage monitor 71, the electrical system load, such as the monitor 75 proximate the controller 69, and a temperature monitor 77, which is typically arranged to measure a temperature of engine coolant, can be provided for this purpose.

Figure 3:
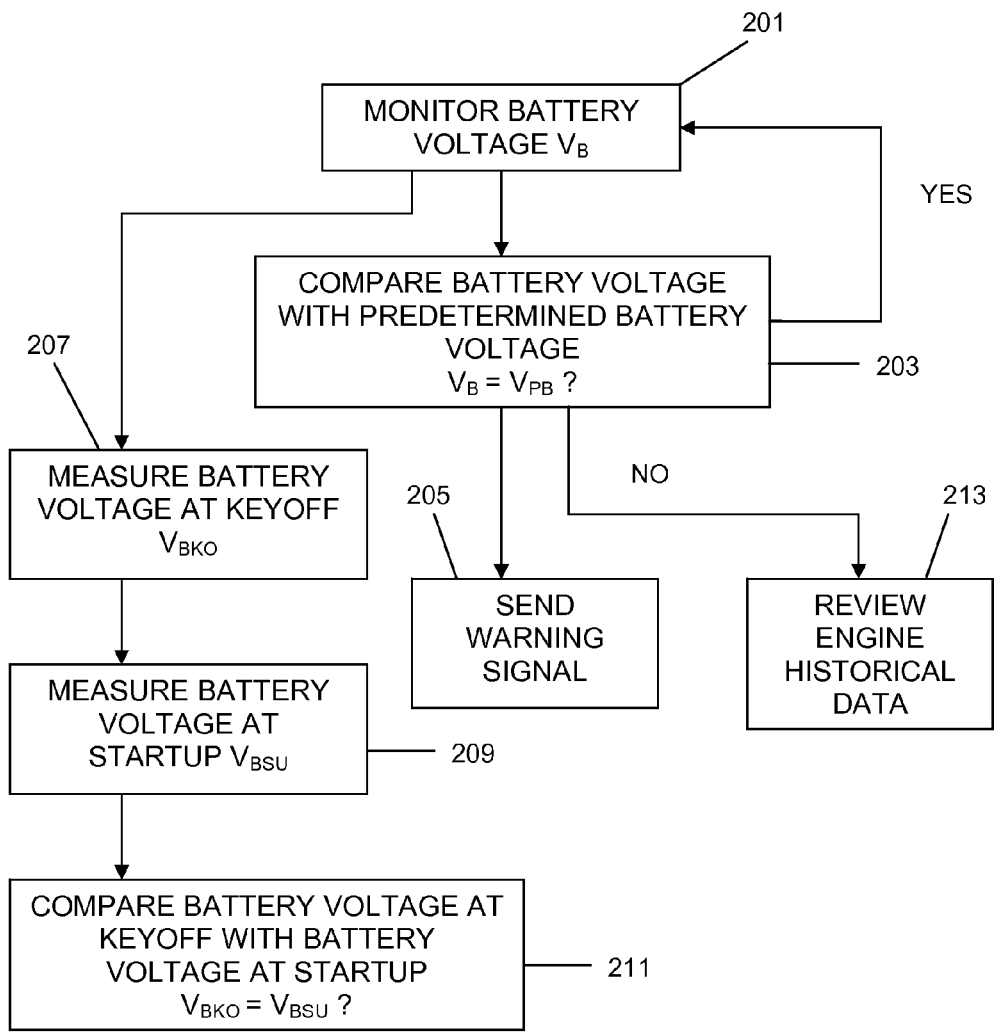
FIG. 3 is a block diagram showing steps in a method according to an aspect of the present invention for monitoring an engine starting system involving monitoring battery voltage.

FIG. 3 illustrates another method according to an aspect of the present invention that is typically, but not necessarily, used in conjunction with the method described in connection with FIG. 2. In the method shown in FIG. 3, step 201 comprises monitoring voltage $V_B$ of the battery 55, such as with the battery voltage monitor 71, and, in step 203, comparing battery voltage with predetermined battery voltage values $V_{PB}$ using the controller 65. If the battery voltage is outside of a predetermined range for the battery voltage, a warning signal can be provided to an operator at step 205 via a warning device 69. There may be a plurality of different warning devices, such as warning lights, or a single warning device adapted to provide a plurality of warning signals, such as a computer screen.

Ordinarily, battery voltage is monitored periodically or continuously during start-up and, if the engine starts, during normal operation. The controller 65 can also record a battery voltage $V_{BKO}$ measurement at the time that the engine is keyed off at step 207 and, if the engine 21 fails to start during a subsequent start-up attempt, the battery voltage $V_{BSU}$ measured at start-up at step 209 can be compared with battery voltage measured when the engine was most recently keyed off at step 211. This can help to determine if the battery was insufficiently charged at the time it was turned off or eliminate the battery as the root cause of the failure to start 11. The battery voltage measured when the engine was most recently keyed off can be stored in a FIFO buffer together with historical data of at least one, usually many, of any previous voltages when the engine was keyed off. This historical data can be useful in assisting the controller or an operator in identifying a weakening trend in the battery, which can assist in diagnosing problems and in predicting problems which can be useful, for example, in avoiding getting a vehicle stranded due to battery problems.

A low battery voltage $V_B$ measurement does not necessarily mean that the battery 55 is the root cause of start-up problems and may merely be a symptom of other equipment or operation problems. Accordingly, other measurements are taken and tests are performed. The battery 55 may, for example, have been run down by the operator in an attempt to start the engine 21, or the battery's low state of charge may be the result of a charging system problem. Diagnosis of a problem with the charging system can be performed in the manner described in connection with FIG. 2. Step 213 of the method of FIG. 3 can include review of historical operational data that can be stored in the controller 65. The stored data can show if the operator abused the starter, such as by holding the key switch in the start position too long or after the engine had started, had drained the battery by over-cranking the engine, which may have been due to some combustion or engine hardware problem, or the engine had had a high frequency of starts, which might warrant provision of a more heavy-duty system. An over-crank protection algorithm for preventing a starter relay from being energized can be provided to prevent abuse of the starter 57. The algorithm can send data that can be stored in the controller and/or communicated outside. The data may be communicated outside for various purposes, such as to advise a technician of the need for maintenance where the data suggests, for example, a hardware problem, or to provide the operator with an explanation why the starter is not allowed to engage, and/or to provide the owner of a fleet of vehicles with information concerning an operator's habits or how the conditions under which the vehicle is typically operated.

Figure 4:
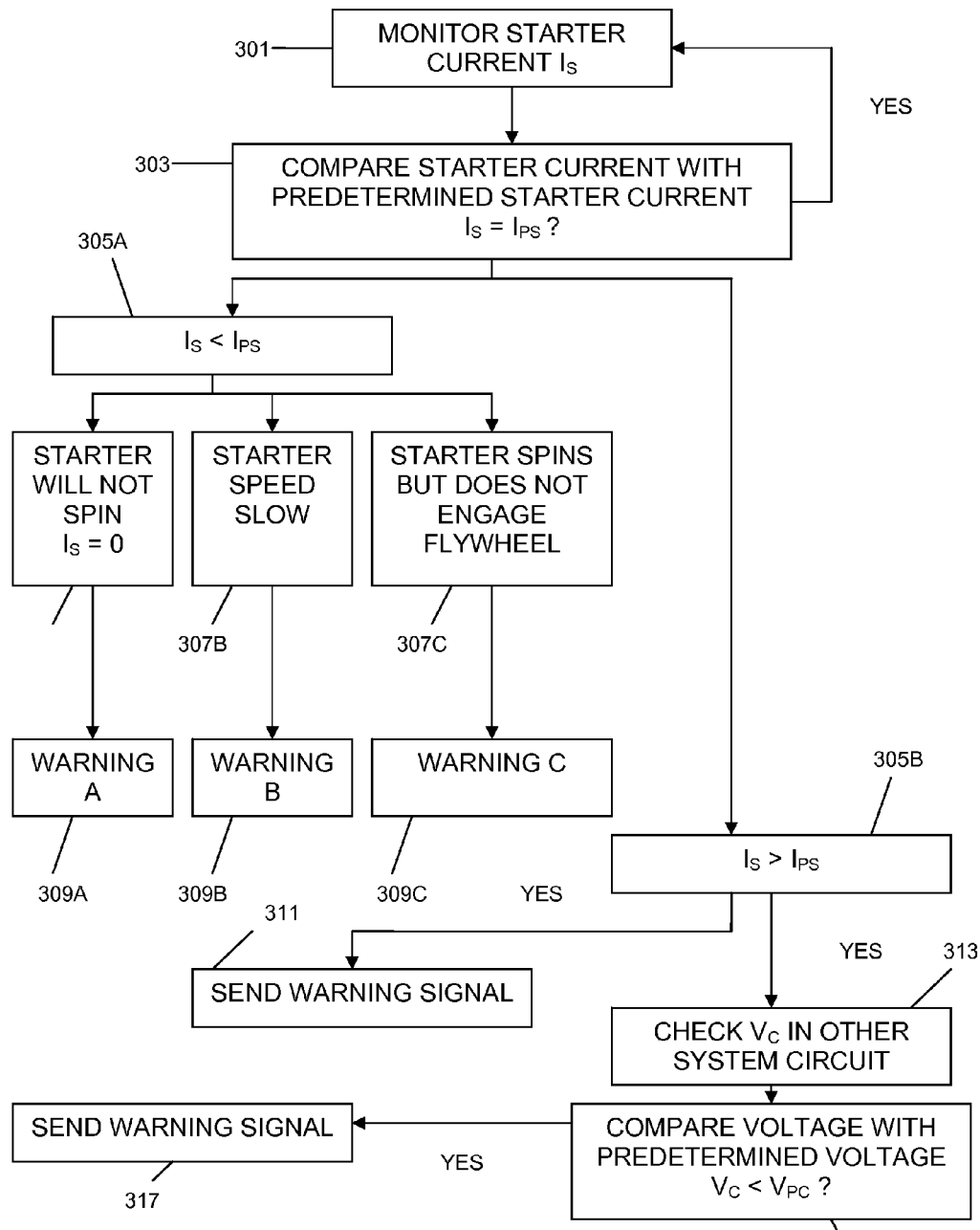
FIG. 4 is a block diagram showing steps in a method according to an aspect of the present invention for monitoring an engine starting system involving monitoring starter current.

FIG. 4 illustrates another method according to an aspect of the present invention that is typically, but not necessarily, used in conjunction with the method described in connection with FIGS. 2 and 3. In the method shown in FIG. 4, step 301 comprises monitoring current through the starter 57. The current through the starter 57 provides valuable information to the diagnostic system. Step 303 comprises comparing starter current with predetermined starter current values. The predetermined starter current draw in an engine depends on variables including the displacement and compression of the engine. The predetermined starter current values can be predicted and thereafter modified based on engine historical data.

Steps 305a and 305b comprise determining if the starter current is below or above the predetermined starter current values, respectively. A low current reading can indicate that the solenoid or relay is receiving battery 55 voltage but is not closing or passing enough amps from the battery to spin the starter motor, the solenoid ground may be bad, or the contacts in the solenoid may be worn, pitted or corroded. In such circumstances, a new solenoid, not a new starter, may be required. On the other hand, if, during cranking, the voltage drops in other circuits in the system to a low level, such as when lights dim, and there is little or no cranking during attempts to start-up the engine, the starter 57 may be locked up, dragging or suffering from high internal resistance, worn brushes, shorts or opens in the windings or armature. In these circumstances, the starter current measurement will typically indicate that the starter 57 is pulling too many amps.

If the starter current is below the predetermined starter current values, at step 307a it is determined whether the starter 57 will not spin and draws zero current, at step 307b it is determined whether the starter spins more slowly than a predetermined starter speed, and at step 307c it is determined whether the starter spins but fails to engage the flywheel. If at step 307a it is determined that the starter 57 does not spin and draws zero current, this may be symptomatic of an open field circuit, open armature coils, defective brushes, or a defective solenoid and an appropriate warning message ("Warning A") can be sent from the controller 65 to a warning device at step 309a. If at step 307b it is determined that the starter 57 spins more slowly than the predetermined starter speed, this may be symptomatic of high internal resistance in the starter which may be indicative of bad connections, bad brushes, or open field coils or armature windings and an appropriate warning message ("Warning B") can be sent from the controller 65 to a warning device at step 309b. If at step 307c it is determined that the starter 57 spins but fails to engage the flywheel, this may be symptomatic of a weak starter solenoid, a defective starter drive, or broken teeth on the flywheel and an appropriate warning message ("Warning C") can be sent from the controller 65 to a warning device at step 309c.

If it is determined at step 305b that the starter current is above the predetermined starter current values, a signal can be sent at step 311 to the operator via the warning device 69 to check a condition of the starter 57. Instead of sending a signal at step 311, or in addition to sending a signal at step 311, voltage in at least one other starter system circuit can be monitored during start-up at step 313 and, if starter current is above the predetermined starter current values and it is determined at step 315 that voltage has dropped in the at least one other system circuit below a predetermined voltage level, then a signal can be sent at step 317 to the operator via the warning device 69 to check a condition of the starter 57. The determination that the voltage has dropped elsewhere in addition to a determination that starter current is high can indicate that the starter is pulling too many amps, which may be a more definitive symptom useful to a technician that the starter is locked up, dragging or suffering from high internal resistance, worn brushes, shorts or opens in the windings or armature. The voltage can be monitored in any suitable circuit, but it is presently preferred to monitor voltage proximate the controller 65.

When an engine cranks normally but will not start, diagnosing the problem can include checks for proper performance of ignition, fuel and compression components. A check can be performed on a crankshaft position sensor 79. The crankshaft position sensor 79 should be free from electrical faults and properly adjusted. In modern engines, considerable diagnostics are ordinarily in place in the engine controller around the crankshaft position sensor 79. A secondary cam position sensor 81 also provides speed and timing information as well. In the method according to the present invention, the health of the crankshaft position sensor and the secondary cam position sensor 81 is monitored and this information is used by the controller 65 to judge the integrity of the engine speed signal and crank angle.

Another check can be performed regarding proper fueling of the engine 21. This can include a check of voltage and ground at the fuel injectors. Modern engine controllers 65 typically have diagnostics regarding the injector coils and fuel system to detect problems with fueling the engine. Other inputs to the controller can include a fuel pressure signal and fuel filter signal. These signals can be provided to determine whether there is a failed fuel pump, pump relay, fuse or wiring problem. Lack of fuel can also be caused by obstructions in the fuel line and, of course, an empty fuel tank.

If cranking and fuel injection do not appear to be preventing starting, the root cause for the engine not starting is often serious engine hardware. The starting system can be provided with limited diagnostics to diagnose mechanical system wear or improper engine assembly.

A low idle state can affords an opportunity to evaluate the individual contribution of each power stroke. If there is a weak cylinder, it may be identified and further testing can be performed. For example, if current from the battery is monitored, a series of humps in a current trace can represent a cylinder firing. The amount of current supplied from the battery to crank the engine can be an important indicator whether the cylinders are operating properly. As each cylinder fires it provides energy to turn the engine over, and the starter has less work to do and, thus, less current is required.

If there is a catastrophic event like an engine over-speed, low oil pressure or engine over temperature the engine's controller 65 can log that event and record it in the engine's fault history. If all of the above sub-systems are fault free the engine hardware will ordinarily then be examined manually.

It will be appreciated that the various steps of the method according to aspects of the present invention can be programmed and stored on a computer readable medium, such as a disk, a drive, and the like. The program can automatically perform the various steps. The steps may be performed continuously, periodically, or upon command from an operator, as desired.

While this invention has been illustrated and described in accordance with a preferred embodiment, it is recognized that variations and changes may be made therein without departing from the invention as set forth in the claims.

What is claimed is:

1. A method of monitoring an engine starting system in an engine, the engine starting system comprising a charging system, a battery, a starter, a flywheel, and a controller, the method comprising:
   reciprocating a plurality of pistons of the engine through respective power strokes;
   monitoring current through the starter during each respective power stroke of the plurality of pistons and comparing starter current with predetermined starter current values for power strokes of the plurality of pistons; and
   providing a signal to an operator if the starter current during the respective power stroke of one or more of the plurality of pistons is outside of a predetermined range for the starter current for the power strokes of the plurality of pistons.

2. The method as set forth in claim 1, comprising monitoring voltage of the battery and comparing battery voltage with predetermined battery voltage values, and providing a signal to an operator if the battery voltage is outside of a predetermined range for the battery voltage.

3. A computer program on a computer readable medium for performing the method of claim 2.

4. A computer program on a computer readable medium for performing, the method of claim 1.

5. An engine having a startling system comprising:
   a plurality of pistons that are reciprocable through respective power strokes;
   a starter;
   a controller;
   a monitor configured to monitor current through the starter during each respective power stroke of the plurality of pistons and sending a signal corresponding to the starter current during each respective power stroke of the plurality of pistons to the controller; and
   the controller being configured to compare the starter current with predetermined starter current values for power strokes of the plurality of pistons and to provide a signal to an operator if the starter current during the respective power stroke of one or more of the plurality of pistons is outside of a predetermined range for the starter current for the power strokes of the plurality of pistons.

* * * * *